United States Patent
Yuhara et al.

Patent Number: 4,510,410
Date of Patent: Apr. 9, 1985

[54] ELASTIC SURFACE WAVE ABSORBERS COMPRISING ULTRAVIOLET LIGHT CURABLE RESIN

[75] Inventors: Akitsuna Yuhara, Yokohama; Kazuo Nate, Machida; Tatsuro Toyama, Kanagawa; Jun Yamada, Yokohama, all of Japan

[73] Assignee: Hitachi, Ltd., Tokyo, Japan

[21] Appl. No.: 507,463

[22] Filed: Jun. 24, 1983

[30] Foreign Application Priority Data

Jul. 7, 1982 [JP] Japan ............... 57-116791

[51] Int. Cl.³ ............... H03H 9/25
[52] U.S. Cl. ............... 310/313 D; 204/159.17
[58] Field of Search ............... 204/159.13, 159.15, 204/159.16, 159.17; 310/313 A, 313 D

[56] References Cited

U.S. PATENT DOCUMENTS

| | | | |
|---|---|---|---|
| 3,956,646 | 5/1976 | Shibayama et al. | 310/313 A |
| 4,033,840 | 7/1977 | Fujiwara et al. | 204/159.17 |
| 4,188,596 | 2/1980 | Miura | 310/326 |
| 4,276,135 | 6/1981 | Sato et al. | 204/159.13 |
| 4,339,474 | 7/1982 | Kishida et al. | 204/159.16 |

*Primary Examiner*—William H. Beha, Jr.
*Assistant Examiner*—D. Rebsch
*Attorney, Agent, or Firm*—Antonelli, Terry & Wands

[57] ABSTRACT

An elastic surface wave device that has good frequency characteristics and no unwanted signals, and is highly suited for mass production, comprising a piezoelectric substrate, at least one pair of transmitting and receiving electrodes on the surface of said substrate, and elastic surface wave absorbers formed by curing a composition, the main component of which is a resin curable by ultraviolet radiation, disposed on at least part of the zone on said piezoelectric substrate that propagates unwanted elastic surface waves.

15 Claims, 3 Drawing Figures

ELASTIC SURFACE WAVE ABSORBERS COMPRISING ULTRAVIOLET LIGHT CURABLE RESIN

BACKGROUND OF THE INVENTION

The present invention relates to an elastic surface wave device wherein the absorbers used to attenuate unwanted elastic waves are more effective, and the process for forming said absorbers is simple.

In elastic surface wave devices, the reflection of elastic surface waves from the substrate edges on the extensions in the elastic surface wave propagation path generates ripples in the amplitude frequency and phase frequency characteristics. These unwanted reflected waves must be prevented from occurring. In the past, elastic surface wave absorbers have been placed near the substrate edges on the extensions in the elastic surface wave propagation path.

Figure 1:
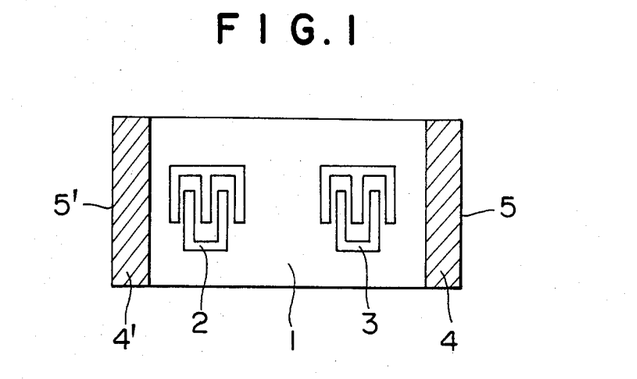
FIG. 1 is a plan view of the elastic surface wave device.

FIG. 1 is a plan view of a surface elastic wave device provided with said absorbers. Here, 1 represents a piezoelectric substrate, 2 an input electrode that converts an electric signal to an elastic surface wave, 3 an output electrode that converts an elastic surface wave into an electrical signal, 4 and 4' elastic surface wave absorbers that attenuate or extinguish the elastic surface waves, and 5 and 5' substrate edges. Half the energy of the elastic surface waves excited by input electrode 2 travels directly towards output electrode 3, while the remaining half proceeds in the reverse direction, is reflected at substrate edge 5' on the input electrode side, and eventually reaches output electrode 3. Nor are all the elastic surface waves that initially proceed towards output electrode 3 converted directly into electrical signals at the output electrode; half of the elastic surface wave energy moving in this direction travels to substrate edge 5 on the output electrode side, where it is reflected back again to output electrode 3. The reflected waves generated at these edges become unwanted signals having a time lag with respect to the main signal, resulting in the appearance of ripples in the aforementioned frequency characteristics. Elastic surface wave absorbers 4 and 4' are provided to fully attenuate or extinguish the unwanted waves by first attenuating the elastic surface waves while transmitting them to edges 5 and 5', then once again attenuating the reflected waves proceeding inwards from these edges; in this way, they prevent adverse effects by the unwanted waves upon the main signal.

In conventional elastic surface wave devices, thermosetting resins such as epoxy resin are used to form the elastic surface wave absorbers. For example, Japanese Patent Application Kokai (Laid-open) No. 56-36815 mentions that, based on comparisons of a number of different materials, epoxy resins show excellent elastic surface wave attenuation characteristics. It also notes that these attenuation characteristics are further improved by mixing and dispersing powders such as cement, nickel, silver, $Al_2O_3$, $Bi_2O_3$, $WO_3$, or the like in the epoxy resin as fillers.

However, epoxy resins have the following two disadvantages.

The first of these is that the reflection at the edge of epoxy resin elastic surface wave absorbers proper is considerable, remaining greater than −40 dB with respect to the main signal, i.e. surface acoustic wave. In experiments conducted by the present inventors, the results obtained ranged from about −25 to −35 dB. This value of −40 dB or less with respect to the main signal is a standard that has been set for unwanted signal wave levels in light of the ghost detection limit in applications to elastic surface wave filters for TV-IF (Intermediate Frequency Circuit of Television Receiver), and the like, (refer to, for example, pp 504–508 of the 1978 IEEE Transactions on Sonics and Ultrasonics). Measures such as those presented, for example, in U.S. Pat. No. 4,188,596, Japanese Patent Application Kokai (Laid-open) No. 53-109458, and Japanese Patent Application Kokai (Laid-open) No. 54-4054 have been taken to meet this standard. These consist, for instance, of scattering the unwanted waves by providing epoxy resin elastic surface wave absorbers with a sawtoothed pattern, as seen in vertical cross-section, or of applying silicon resin or some like material that has little attenuation but generates only limited reflection at the absorber edges either adjacent to the edges, or on top, of the epoxy resin, etc. However, this increases the size of the substrate in the elastic surface wave device. In addition, because two types of absorbers are included in the device, the number of manufacturing steps increases, driving up the cost of production. This drawback is especially telling when the substrate dimensions are increased in order to reduce the working frequency, increase the wavelength of the elastic surface waves, and expand the width of the elastic surface wave absorbers in the direction of propagation.

The second disadvantage of epoxy resins is that, because these are thermosetting resins, they have a long curing time; as a result, it is difficult to automate the production steps, making such resins unsuitable to mass production. In addition, this invites numerous other problems responsible for poor mass production potential and inflated production costs, such as cracking and increased crackability of the piezoelectric substrate under heating, and also poor curing as a result of fluctuations in the curing temperature.

SUMMARY OF THE INVENTION

The object of the present invention is to provide an elastic surface wave device with elastic surface wave absorbers that is free of the above drawbacks, has elastic surface wave attenuating characteristics superior to those of existing devices in the prior art, and lends itself readily to mass production.

In attaining this object, the present inventors have given consideration as follows to the elastic surface wave attenuation mechanism of the elastic surface wave absorbers and the properties of the absorber material.

The attenuation of elastic surface waves is based on the following three actions: (a) impingement of the elastic surface waves on the absorbers, where some of them undergo a mode transformation; (b) entry of the elastic waves into the absorbers (at which time, part of the wave energy is transferred to the absorbers); and (c) conversion of the energy of the elastic surface waves that have entered the absorbers into thermal energy, due to the viscoelasticity of the absorbers.

(a) In mode transformation, the elastic surface waves are emitted within the substrate as bulk waves and the like, but when these arise over the extremely short range in the direction of propagation, there is, of course, considerable reflection of the elastic surface waves. As noted earlier, the reflection at the edges of the absorbers made of thermosetting epoxy resin is large, this being due to the circumstances described above. The material desired in the present invention should have a large ratio of conversion to bulk waves, etc. It should moreover be a material in which mode transformation occurs continuously over a predetermined range, and one that does not produce elastic surface wave reflections of uniform phase.

(b) The entry of the elastic surface waves into the absorber begins where these waves strike the absorber. As the elastic surface waves travel forward, elastic surface waves coupled with the piezoelectric substrate start propagating also into the absorbers. The mode transformation described in (a) arises in this transition region. The higher the ratio of the elastic surface wave energy density within the absorbers to the elastic surface wave energy density within the piezoelectric substrate, the more desirable for the absorber. This ratio tends to become larger when the acoustic impedance $Z_A$ of the absorbers is close to the acoustic impedance $Z_S$ of the elastic surface wave mode of the piezoelectric substrate. The acoustic impedance is the square root of the product of the density and modulus of elasticity. The density $P_A$ and modulus of elasticity $E_A$ of the main resin components in the absorbers are small relative to the corresponding values $P_S$ and $E_S$ for representative piezoelectric substrates. To obtain impedance matching, absorber material with a large density $P_A$ and a large modulus of elasticity $E_A$ should be selected. However, it should be noted that when the acoustic impedance $Z_A$ of the absorber is excessively large, or even when it is about equivalent with the acoustic impedance for the elastic surface wave mode of the piezoelectric substrate, the reflection of elastic surface waves actually increases in the case of absorbers having a cross-sectional shape that behaves as a large, sharp substrate "wall" with respect to the elastic surface waves.

(c) The viscoelasticity of the absorber is expressed below as the dynamic complex modulus of elasticity, $E^*$.

$$E^* = E' + jE'' = E' + jwn = T^*/S^* \quad (1)$$

where $E'$ is the real part of the complex modulus of elasticity, $E'$ is the imaginary part thereof, $j$ is the imaginary unit, $n$ is the dynamic viscosity, $w$ is the angular frequency, $T^*$ is the complex stress, and $S^*$ is the complex strain. The imaginary number part of Eq. (1) is a term proportional to the time differential coefficient of the strain, and serves as the main factor of the energy loss in the absorber. The n for resins used in absorbers is generally larger than that of the piezoelectric substrate. It was noted earlier that, because the acoustic impedance $Z_A$ of the absorbers approaches that of the piezoelectric substrate, it is preferable that the modulus of elasticity $E_A$ of the absorbers be on the large side. To enhance the absorption characteristics, n should also be on the large side, as is clear from Eq. (1). However, a large rigidity (large $E'$) and a large n do not necessarily go hand in hand. When $E'$ is small, the elastic surface waves fail to enter the absorbers, even at large n, as a result of which large attenuation of the elastic surface wave does not occur.

The inventors discovered, based on these observations, that the standards of choice in selecting materials for use in elastic surface wave absorbers are a large modulus of elasticity and a large specific gravity (see test examples given below). In other words, the inventors discovered that the chief factors that determine the ability of a surface wave absorber material to absorb elastic surface waves after setting are the specific gravity and the hardness, which corresponds to the modulus of elasticity.

In the present invention, elastic surface wave absorbers formed by curing a composition, the main component of which is resin curable by ultraviolet radiation, are used. This composition can easily be cured in a relatively short time and at low temperatures, making it well-suited to the low-cost mass production of elastic surface wave devices.

The inventors also found that absorbers formed by curing a UV radiation-curable resin composition containing the three main components described below are endowed with excellent absorption characteristics. They found also that the actual absorption rises both with increasing hardness, which depends on the base resin selected for use, and with increasing specific gravity through the addition of filler. The inventors learned that elastic surface wave absorbers prepared by curing said UV radiation-curable resin composition exhibit little reflection at the edges thereof, and are therefore free of the disadvantages observed when conventional epoxy resins are used.

The inventors examined various UV radiation-curable resins, discovering those comprising a mixture of the following components to be suited to the object of the present invention: 100 parts by weight of at least one of the group of photopolymerizable resins consisting of 1,2-polybutadiene resins with terminal acryloyloxy or methacryloyloxy groups, organosiloxanes with terminal acryloyloxy or methacryloyloxy groups, epoxyacrylate-based resins, unsaturated polyester resins, unsaturated urethane resins, or the like, as the first component; from 10 to 70 parts by weight of an addition-polymerizable monomer having at least one $CH_2=C$ group and a boiling point of not less than 100° C. at normal pressure, as the second component; from 0.05 to 5 parts by weight of a photosensitizer as the third component; and, if necessary, fillers, thixotropic agents, tackifying additives, thermal polymerization initiators, colorants, and the like. Absorber compositions using this type of UV radiation-curable resin as the main component are easy to handle, and can be applied as desired onto elastic surface wave devices by screen printing, or some other method. The studies for identifying suitable materials mentioned above were conducted using primarily 127.9°-rotated, Y-cut, X-propagating lithium niobate (LiNbO$_3$) single crystals (hereafter, LiNbO$_3$ substrate), which are widely used in the field, as the piezoelectric substrate.

The photopolymerizable resin used in the present invention as the first component is preferably 1,2-polybutadiene resin or organosiloxane with, for example, terminal acryloyloxy or methacryloyloxy groups having a molecular weight of from 400 to 10,000, epoxyacrylate-based resin, or the like. A molecular weight of less than 400 is not desirable because this gives an inferior UV radiation-curability, while a molecular weight of more than 10,000 is also undesirable as this results in a UV-curable resin composition having a high viscosity, and thus poor workability. A molecular weight of from 2,000 to 5,000 is preferable when, for example, applying the composition by a printing process.

The addition-polymerizable monomer used as the second component preferably has at least one $CH_2=C$ group and a boiling point of 100° or higher at normal pressure. Addition-polymerizable monomers with boiling points of less than 100° C. may volatize as the resin viscosity rises or the resin radiation-cures during production; this is undesirable from the standpoint of safety as well. This addition-polymerizable monomer may consist of one, or a mixture of two or more, of the following monomers: styrene, styrene derivatives such as vinyltoluene, acrylic acid, acrylic acid-based compounds such as butyl acrylate, lauryl acrylate, 2-hydroxyethyl acrylate, and 2-hydroxypropyl acrylate, methacrylic acid, methacrylic acid-based compounds such as butyl methacrylate, lauryl methacrylate, 2-hydroxyethyl methacrylate, and 2-hydroxylpropyl methacrylate, polyfunctional acrylic ester-based compounds having at least two unsaturated groups, such as 1,6-hexanediol dimethacrylate, ethylene glycol dimethacrylate, trimethylolpropane trimethacrylate, and neopentylglycol diacrylate, and in addition, polyfunctional vinyl monomers such as divinylbenzene and diacrylate, and the like. The use of these monomers in a range of from 10 to 70 parts by weight on the basis of 100 parts by weight of the photopolymerizable resin is effective. The use of less than 10 parts by weight is undesirable in practice as this results in a cured film having poor mechanical strength, in addition to which the rate of the photopolymerization reaction is slow and therefore inconvenient. Similarly, the use of over 70 parts by weight results in a decline in the mechanical strength and heat resistance of the cured film. Both these cases are improper for practical applications.

The photosensitizer used as the third component may be one, or a mixture of two or more, of the following photosensitizers: benzoin and its derivatives, benzoin ethers such as benzoin methyl ether and benzoin isopropyl ether, benzyl and its derivatives, aryl diazonium salts, anthraquinone and its derivatives such as 2-methylanthraquinone, acetophenone and its derivatives, sulfur compounds such as diphenyldisulfide, benzophenone and its derivatives such as 4-methoxybenzophenone, and the like. The use of these photosensitizers in a range of from 0.05 to 5 parts by weight on the basis of 100 parts by weight of the photopolymerizable resin is effective. The use of less than 0.05 part by weight is not desirable as this results in a slow radiation-curing rate for the radiation-curable resin and fails to provide a cured film with excellent mechanical strength. On the other hand, the use of more than 5 parts by weight is also undesirable as this does not give a cured resin of high molecular weight. Both of these cases are improper for practical applications. The addition of from 0.3 to 3 parts by weight of the photosensitizer is particularly effective.

Powders such as $\alpha$-alumina powder, as well as silicon dioxide, calcium carbonate, titanium dioxide, barium oxide, nickel, iron, cobalt oxide, zirconium oxide, lead oxide, lead dioxide, tungsten, tungsten oxide, bismuth oxide, and mica may be used as the filler.

There is an upper limit to the amount of filler that may be added. When the filler has a large specific gravity, this limit is due to reflection at the edges of the elastic surface wave absorbers. In the case of fillers having a small specific gravity, this limit is imposed by an increase in the powder volume, and hence the specific surface area, which results in lower workability, when the filler is mixed into the resin. The amount of filler used should preferably be 0-250 parts by weight of $\alpha$-alumina, 0-100 parts by weight of silicon dioxide, 0-200 parts by weight of calcium carbonate, 0-250 parts by weight of titanium dioxide, 0-150 parts by weight of barium sulfate, 0-120 parts by weight of barium oxide, 0-100 parts by weight of nickel, 0-120 parts by weight of iron, 0-100 parts by weight of cobalt oxide, 0-120 parts by weight of zirconium oxide, 0-100 parts by weight of lead oxide, 0-120 parts by weight of lead dioxide, 0-100 parts by weight of tungsten, 0-120 parts by weight of tungsten oxide, 0-120 parts by weight of bismuth oxide, and 0-200 parts by weight of mica, on the basis of 100 parts by weight of the first component.

Silicon dioxide powder having a specific surface area of from 100 to 450 $m^2/g$ is appropriate as the thixotropic agent. Silane coupling agents such as $\gamma$-methacryoxypropyltrimethoxysilane, vinyltris($\beta$-methoxyethoxy)silane, and $\gamma$-aminopropyltrimethoxysilane are suitable as the tackifying additive. Ordinary pigments and dyes such as phthalocyanine green or phthalocyanine blue may be used as the colorant.

Ordinary polymerization initiators, including organic peroxides such as benzoyl peroxide, acetyl peroxide, or lauryl peroxide, and azobisisobutyronitrile, may be used as the thermal polymerization initiator.

In addition, where necessary, antioxidants and surface curing promoters may be used. Normal thermal polymerization inhibitors such as hydroquinone, hydroquinone methyl ether, catechol, and 2,6-di-t-butyl-4-methylphenol are effective as the antioxidant, while organic acid metal salts such as cobalt naphthenate and manganese octylate are suitable as the surface curing promoter.

Examples of resin curing light sources useful in the present invention include high-pressure mercury lamps, ultrahigh-pressure mercury lamps, metal halide lamps, carbon arc lamps, xenon lamps, and the like. In the production of the elastic surface wave device in the present invention, the UV radiation-curable resin that eventually forms the elastic surface wave absorbers is cured by irradiation with the above-described light source, but may be, if necessary, prebaked or postbaked before or after UV irradiation.

A further understanding of the present invention will be gained from the test examples, examples of the invention, and drawings described below.

PREFERRED EMBODIMENTS OF THE INVENTION

Test Example 1

A suitable selection of compositions containing only the main components, i.e., a base resin, an addition-polymerizable monomer, and a photosensitizer, and having each a modulus of elasticity and a specific gravity that can be controlled, was made from the above-described group of UV radiation-curable resin compositions. These selected compositions were prepared and their properties investigated. Table 1 gives the composition and absorption coefficients ($\alpha=dB/\lambda$) of these UV radiation-curable resins, and includes also a commercially available epoxy resin (Cemedine 1500, hardened for two hours at 60° C.) as a comparative example. The elastic surface wave absorption coefficient $\alpha$ was measured at a center frequency of 14.74 MHz using the above-mentioned LiNbO$_3$ substrate as the piezoelectric substrate. This value α was obtained by measuring the increment in attenuation when an elastic surface wave absorber ranging in thickness from 30 to 200 μm is provided between the input electrode and output electrode in an elastic surface wave filter having the structure shown in FIG. 1, and converting this into the increment in attenuation per wavelength of the elastic surface waves.

Figure 2:
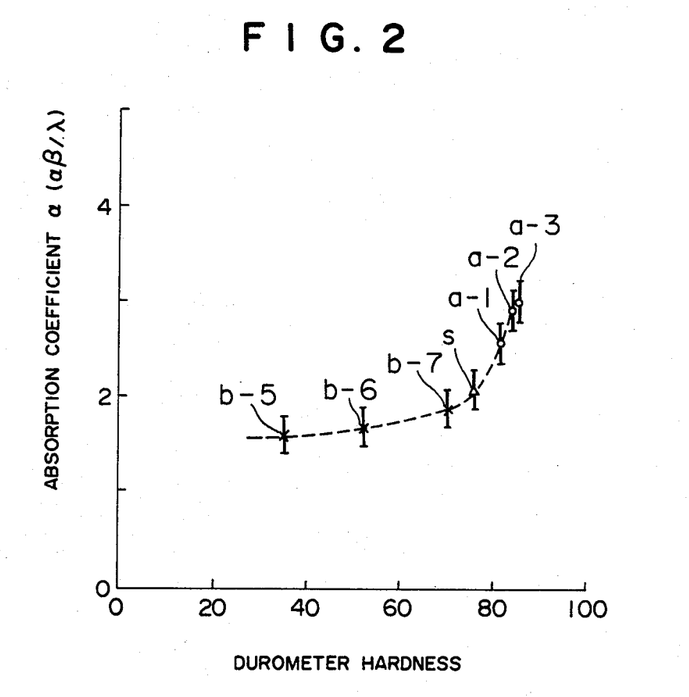
FIG. 2 is a plot of the durometer hardness of the absorbers versus the absorption coefficient $\alpha$.

First, the modulus of elasticity effects were checked. In resin materials, the modulus of elasticity can easily be measured by conducting a hardness test. This was thus measured using a D-type durometer for measuring indentation hardness that is also widely employed in the measurement of rubber hardness, etc. FIG. 2 is a plot of the durometer hardness versus the absorption coefficient α. FIG. 2 shows the UV radiation-curable resin composition presented in Table 1 that are formulated using only the main components. It is clear here that the absorption coefficient increases together with the hardness; This plot shows that because the systems containing epoxydiacrylate as the base resin are harder than the 1,2-polybutadiene diacrylate systems, their absorption coefficients α are larger (the attenuation effects are large). The hardness also varies somewhat with the addition-polymerizable monomer. However, in the epoxy acrylate systems, for example, the hardness and absorption coefficient for those compositions containing addition-polymerizable monomers other than that present in composition a-1 are the same as those for composition a-1, within the normal range of error. Moreover, epoxyacrylate systems to which additives and other components were added had absorption coefficients and hardnesses equivalent to or greater than composition a-1 in Table 1 (in hardness measurements taken with the durometer, the accuracy is poor at above the indicated value of 80). Also noteworthy in FIG. 2 is that even a 1,2-polybutadiene dimethacrylate system containing only the main components, which has a relatively low hardness and absorption coefficient, demonstrates a performance equivalent to that of the attenuation per wavelength, 1.74 dB/λ for the epoxy resin (Araldite, CIBA-Geigy Corp.) indicated as commercially available in above-cited Japanese Patent Application Kokai (Laid-open) No. 56-36818. This is a clear indication that the UV radiation-curable resin system possesses an excellent potential for use in elastic surface wave absorbers, and that even better properties can be obtained by the use of additives.

Test Example 2

Figure 3:
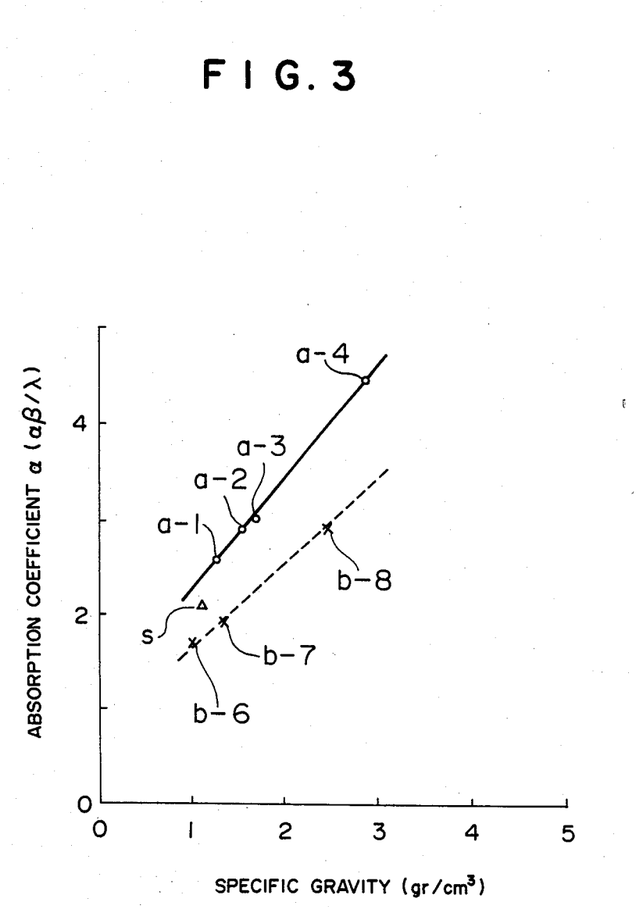
FIG. 3 is a graph of the specific gravity of the absorbers versus the absorption coefficient $\alpha$.

Next, the effects of the specific gravity of the resin were checked. FIG. 3 is a plot of the specific gravity of the resins shown in Table 1 as measured by water displacement versus the absorption coefficient α. The absorption coefficient rises with increasing specific gravity of the resin both in systems in which the base resin is epoxyacrylate and in systems in which this is 1,2-polybutadiene methacrylate. The relation of the absorption coefficient to the specific gravity lies on different linear plots for each type of base resin, this being due to the difference in hardness.

To obtain the measurement shown in FIG. 3, resins containing various fillers were prepared, and elastic surface wave absorbers formed. These results show clearly that the addition of filler raises the specific gravity of the elastic surface wave absorbers.

It was noted earlier that one important consideration regarding elastic surface wave absorbers is that there be little elastic surface wave reflection from the absorber edges. As is demonstrated later in the examples illustrating embodiments of the present invention, the elastic surface wave absorbers prepared from the UV radiation-curable resins in Table 1 all provided sufficiently small reflection levels of −40 dB or less.

However, in the case of composition a-4, in which a large amount of filler having a high specific gravity was mixed, great care must be taken during resin preparation, coating, curing, and other processes as a somewhat large reflection of −30 to −35 dB with respect to the main signal frequently arises at the edges of the elastic surface wave absorbers. An upper limit exists for the use of fillers with large specific gravities in particular, as shown by the filler amounts specified earlier.

In the comparative example S in which an epoxy resin was used, a reflection from the elastic surface wave absorber edges of −35 to −40 dB with regard to the main signal sometimes arises, but when 50 parts by weight of α-alumina is added to epoxy resin, reflection by the elastic surface wave absorbers increases to −30 to −35 dB.

In addition, when heat-curable polybutadiene resin is used, reflection by the elastic surface wave absorbers of −25 to −35 dB with respect to the main signal arises (Japanese Patent Application Kokai [Laid-open] No. 54-40543).

The elastic surface wave absorbers formed from UV radiation-curable resin according to the present invention are thus superior in performance to conventional absorbers on account of their larger absorption and smaller reflection, as well as other properties. Moreover, because the epoxy resin used in conventional absorbers is heat-curable, it presents a number of difficulties, such as a long processing time, heat-cracking of the substrate, and the formation of curing defects due to non-uniform curing temperatures, that make conventional absorbers unsuited to mass production. In contrast, the work required to prepare the absorbers according to the present invention involves only a short exposure to ultraviolet light; in the absence of any large increases in the temperature on the substrate, substrate cracking and other problems do not arise, in addition to which the production processes can easily be automated. Absorber production is thus made much easier, providing a very significant advantage in the case of components for home appliances such as TV-IF filters.

The present invention is further illustrated by the following examples.

EXAMPLE 1

One hundred parts by weight of 1,2-polybutadiene resin with terminal methacryloyloxy groups and having a molecular weight of about 2,600, 15 parts by weight of ethylene glycol methacrylate, 15 parts by weight of trimethylol propane, one part by weight of 2-methylanthraquinone, 50 parts by weight of silicon dioxide powder having a surface area of 380 m$^2$/g, 50 parts by weight of α-alumina powder with a particle size of about 1 μm, and 3 parts by weight of γ-methacryloxypropyltrimethoxysilane were stirred and uniformly mixed to form a resin composition. This composition was applied with conventional screen printer at a thickness of about 50 μm at the points indicated in FIG. 1 as elastic surface wave absorbers 4 and 4'. A LiNbO$_3$ substrate was used as the piezoelectric substrate. The input electrode was an unapodized interdigital transducer consisting of 15 pairs of double electrodes having electrode widths of 8.6 μm, and the output electrode was an apodized interdigital transducer consisting of 60 pairs of double electrodes having electrode widths of 8.6 μm. The electrode material was a 0.8 μm aluminum film formed by hot etching. Following application onto the substrate, the elastic surface wave absorbers of the above composition were cured by irradiation with a 120 W/cm per arc length metal halide lamp at a distance of 15 cm for about 40 seconds. The width of the elastic surface wave absorbers in the direction of propagation was made 1 mm. The edge-reflected signal levels for the elastic surface wave devices thus fabricated were measured and found to be −40 dB with respect to the main signal, demonstrating the good absorption characteristics of the absorbers in the present invention, and showing also the low level of reflection by the absorbers. Because ultraviolet radiation was used to cure the absorber, the curing process was conducted rapidly and at a low temperature. As a result no substrate cracking or related defects arose, greatly increasing productivity.

EXAMPLE 2

One hundred parts by weight of 1,2-polybutadiene resin with terminal methacryloyloxy groups and having a molecular weight of about 2,600, 30 parts by weight of ethylene glycol dimethacrylate, 1 part by weight of 2-methylanthraquinone, 5 parts by weight of silicon dioxide powder having a surface area of 380 m²/g, 50 parts by weight of α-alumina powder with a particle size of about 1 μm, and 3 parts by weight of γ-methacryloxypropyltrimethoxysilane were stirred and mixed uniformly to form a resin composition. This composition was applied as in Example 1 to the edges of elastic surface wave device substrates at a thickness of about 50 μm by the same method and in the same shape as in Example 1. Next, the applied composition was prebaked for 30 minutes at 100° C., following which the elastic surface wave absorbers were cured by irradiation with a 120 W/cm metal halide lamp at a distance of 15 cm for about 30 seconds. The edge-reflected signal level for the elastic surface wave devices thus fabricated were measured, and found to be −45 dB with respect to the main signal, confirming the excellent properties of the absorbers according to the present invention. Moreover, ripples in the frequency characteristics were exceedingly small, giving a highly reliable elastic surface wave device.

EXAMPLE 3

One hundred parts by weight of 1,2-polybutadiene resin with terminal methacryloyloxy groups and having a molecular weight of about 2,600, 10 parts by weight of ethylene glycol dimethacrylate, 30 parts by weight of 2-hydroxyethylmethacrylate, 1 part by weight of 2-methylanthraquinone, 5 parts by weight of silicon dioxide powder having a surface area of 380 m²/g, 50 parts by weight of α-alumina powder with a particle size of 1 μm, and 3 parts by weight of γ-methacryloxypropyltrimethoxysilane were uniformly stirred and mixed to form a resin composition. This was applied at a thickness of 50 μm at the same place, in the same shape, and by the same method as in Example 1. After prebaking this at 100° C. for 30 minutes, the elastic surface wave absorbers were cured by irradiation with a 120 W/cm metal halide lamp at a distance of 15 cm for about 40 seconds. The edge-reflected signal level for the elastic surface wave devices thus fabricated were measured and found to be −40 dB, confirming the outstanding effects of the elastic surface wave absorbers according to the present invention.

EXAMPLES 4–13

The 10 lresin compositions shown in Table 2 were prepared as Examples 4–13, and these applied to the same type of elastic surface wave device as in Example 1 at a thickness of about 50 μm in the same manner as described in Example 1, forming elastic surface wave absorbers. These absorbers were cured by irradiating them with an ultraviolet light for about one minute. The edge-reflected signal levels for the elastic surface wave devices thus fabricated were measured, and found in all cases to be smaller than −40 dB, demonstrating that the elastic surface wave devices according to the present invention have excellent characteristics showing only exceedingly small ripples.

EXAMPLES 14–19

In Examples 14–19, compositions a-1, a-2, a-3, b-5, b-6 and b-7 of the resin compositions according to the present invention shown in Table 1 were prepared, and these applied at a thickness of about 50 μm to the elastic surface wave device edges in the same manner as in Example 1. The elastic surface wave absorbers were cured by about one minute of ultraviolet irradiation. In Examples 14, 15 and 16 (resins a-1, a-2 and a-3, respectively), the width of the elastic surface wave absorbers was made 0.7 mm in the direction of propagation, while this was made 1 mm in Examples 17, 18 and 19 (resins b-5, b-6 and b-7, respectively). The signals reflected from the edges of the elastic surface wave devices thus fabricated were measured, and found in all cases to be smaller than −40 dB, confirming that the elastic surface wave devices according to the present invention have excellent characteristics with small ripples. In examples 14, 15 and 16 in particular, the width of the elastic surface wave absorbers in the direction of propagation was small, saving substrate surface area, and resulting in a considerable cost advantage.

EXAMPLES 20–27

In Examples 20–27, resin compositions a-1 through a-4, and b-5 through b-8 according to the present invention (shown in Table 1) were prepared, and these applied in thicknesses of from 100 to 200 μm to the edges of elastic surface wave devices by the same method used in Example 1 or by screen printing. In each of these examples, a lithium niobiate substrate was used as the piezoelectric substrate. The input and output electrodes were both photoetched, aluminum electrodes consisting of five pairs of normal electrodes arranged in an interdigital structure and having electrode widths of 32.9 μm and electrode film thickness of 0.8 μm. These electrodes operated at a center frequency of 14.74 MHz. The resin compositions formed in the above manner on the elastic surface wave devices were prebaked at 100° C. for 30 minutes, then cured by irradiation with ultraviolet light. The width of the elastic surface wave absorbers in the direction of propagation was 2 mm in Examples 20, 21, 22, 23, and 27, and 3 mm in Examples 24, 25 and 26. The signals reflected at the edges of the elastic surface wave devices were measured and found in all cases to be less than −40 dB, demonstrating that the elastic surface wave devices according to the present invention have excellent characteristics with small ripples. In Examples 21, 22 and 23 in particular, the reflected signal levels were especially small, in addition to which it was possible to reduce the width of the elastic surface wave devices to 2 mm, which is narrow for low-frequency,. (14.74 MHz) elastic surface wave devices. It was thus possible in these examples to reduce the substrate size of low-frequency elastic surface wave devices, the dimensions in the direction of propagation for which have a tendency to increase. This enables a reduction in the cost of elastic surface wave devices.

An example in which commercially available heat-curable epoxy resin was used as the base resin is also given for comparison with the above examples. One hundred grams of bisphenol-type epoxy resin (epoxy equivalents, 190) and 75 grams of polyamide resin (versamide, Henkel Japan KK; amine number, 390) were mixed, and the mixture applied at the same place and in the same manner as in Example 1, then cured by standing at 100° C. for 30 minutes. The amplitude ripples of the elastic surface wave devices fabricated in this way were 0.5–1 dB. The edge-reflected signal level was −30 to −35 dB for signals reflected from the substrate edges, and −25 to −30 dB for signals reflected from the edges of the absorbers. Therefore, compared with the above examples, the absorption of elastic surface waves was poor, and considerable reflection from the elastic surface wave absorbers was observed. In addition, this resin composition remains usable for only up to several tens of minutes. At the same time, the curing time is long, this also being on the order of several tens of minutes. Such attributes clearly make these absorbers inferior for mass production and ill-suited for practical applications.

It has already been noted that the present invention provides for the rapid formation of elastic surface wave absorbers at relatively low temperatures. This permits the automation of the production processes and is ideally suited for mass production. Furthermore, the elastic surface wave absorption characteristics of the absorbers formed in this way are excellent. The reflection at the edges of the elastic surface wave absorbers, in particular, is greatly reduced, facilitating miniaturization of the elastic surface wave device, this being especially so in the case of low-frequency devices under MHz. The result is a combined improvement in performance and cost-effectiveness.

TABLE 1

| UV radiation curable resin | Base resin as the first component | Addition-polymerizable monomer (reactive diluent) as the second component | Photosensitizer as the third component | Other additives | Absorption coefficient (dB/λ) |
| --- | --- | --- | --- | --- | --- |
| a-1 | Epoxy diacrylate (molecular weight, 1000), 100 | 2-hydroxyethylmethacrylate, 30 | 2-methylanthraquinone, 1 | — | 2.6 |
| a-2 | Epoxy diacrylate (molecular weight, 1000), 100 | 2-hydroxyethylmethacrylate, 15 ethylene glycol dimethacrylate, 15 | 2-methylanthraquinone, 1 | $SiO_2$ powder, 5; α-alumina powder, 50, γ-methacryloxypropyltrimethoxysilane, 3 | 2.9 |
| a-3 | Epoxy diacrylate (molecular weight, 1000), 100 | 2-hydroxyethylmethacrylate, 15 ethylene glycol dimethacrylate, 15 | 2-methylanthraquinone, 1 | $SiO_2$ powder, 5; α-alumina powder, 80; γ-methacryloxypropyltrimethoxysilane, 3 | 3.0 |
| a-4 | Epoxy diacrylate (molecular weight, 1000), 100 | 2-hydroxyethylmethacrylate, 15 ethylene glycol dimethacrylate, 15 | 2-methylanthraquinone, 1 | $SiO_2$ powder, 10; PbO powder, 238; γ-methacryloxypropylsilane, 3 | 4.4 |
| b-5 | 1,2-polybutadiene dimethacrylate (molecular weight, 2,600), 100 | lauryl methacrylate, 30 | 2-methylanthraquinone, 1 | — | 1.6 |
| b-6 | 1,2-polybutadiene dimethacrylate (molecular weight, 2,600), 100 | 2-hydroxyethylmethacrylate, 30 | 2-methylanthraquinone, 1 | — | 1.7 |
| b-7 | 1,2-polybutadiene dimethacrylate (molecular weight, 2,600), 100 | ethylene glycol dimethacrylate, 30 | 2-methylanthraquinone, 1 | $SiO_2$ powder, 5; α-alumina powder, 50; γ-methacryloxypropyltrimethylsilane, 3; phthalocyanine green, 50 | 1.9 |
| b-8 | 1,2-polybutadiene dimethacrylate (molecular weight, 2,600), 100 | 2-hydroxyethylmethacrylate, 15 ethylene glycol dimethacrylate, 15 | 2-methylanthraquinone, 1 | $SiO_2$ powder, 5; PbO powder, 119, γ-methacryloxypropyltrimethoxysilane, 3 | 2.9 |
| Comparative example S | Epoxy resin (Cemedine 1500, Cemedine KK, heat-cured at 60° C. for 2 hours) | | | | 2.1 |

*Mixing ratios are all in parts by weight

TABLE 2

| Example | Base resin as the first component | Reactive diluent as the second component | Photosensitizer as the third component | Other additives | Edge-reflected signal level for elastic surface wave propagative element |
| --- | --- | --- | --- | --- | --- |
| Example 4 | epoxydiacrylate (molecular weight, 1000), 100 | 2-hydroxyethylmethacrylate 20 | benzophenone 2 | fine $SiO_2$ powder, 7: silica powder 50: phthalocyanine green, 0.5, benzoyl peroxide, 2 | −40 |

TABLE 2-continued

| Example | Base resin as the first component | Reactive diluent as the second component | Photosensitizer as the third component | Other additives | Edge-reflected signal level for elastic surface wave propagative element |
|---|---|---|---|---|---|
| Example 5 | epoxydiacrylate (molecular weight, 1000), 100 | 2-hydroxypropylmethacrylate 50 | benzophenone 2 | fine SiO$_2$ powder 10; α-alumina powder, 200; γ-methacryloxypropylmethacrylate, 5 | −40 |
| Example 6 | epoxydiacrylate (molecular weight, 1000), 100 | trimethylolpropane trimethacrylate, 60 | benzophenone 2 | α-alumina powder, 250; γ-aminopropyltrimethoxysilane, 5; phthalocyanine blue, 0.5 | −45 |
| Example 7 | 1,2-polybutadiene dimethacrylate (molecular weight, 2,600), 100 | ethylene glycol dimethacrylate, 30 | benzoin isopropylethyr, 1 | fine SiO$_2$ powder, 5; α-alumina powder, 100; γ-aminopropyltrimethylsilane, 3; phthalocyanine green, 0.5 | −40 |
| Example 8 | 1,2-polybutadiene dimethacrylate (molecular weight, 2,600), 100 | lauryl methacrylate, 30 | benzoin isopropylethyr, 0.5 | fine SiO$_2$ powder, 5; α-alumina powder, 100; γ-aminopropyltrimethoxytrimethylsilane, 3 | −40 |
| Example 9 | 1,2-polybutadiene dimethacrylate (molecular weight, 2,600), 100 | 2-hydroxyethylmethacrylate, 20 ethylene glycol dimethacrylate, 20 | benzoin isopropylethyr, 3 | fine SiO$_2$ powder, 5; silica powder, 100; γ-methacryloxypropylmethacrylate, 5 | −45 |
| Example 10 | 1,2-polybutadiene dimethacrylate (molecular weight, 2,600), 100 | ethylene glycol dimethacrylate, 30 | 2-methylanthraquinone, 1 | fine SiO$_2$ powder, 5; α-alumina powder, 100; γ-methacryloxypropylmethacrylate, 3; phtholocyanine green, 0.5 | −40 |
| Example 11 | 1,2-polybutadiene dimethacrylate (molecular weight, 2,600), 100 | 2-hydroxyethylmethacrylate, 30 ethylene glycol methacrylate, 10 | 2-methylanthraquinone, 1 | fine SiO$_2$ powder, 5; γ-alumina powder, 100; γ-methacryloxypropylmethacrylate, 3; benzoyl peroxide, 3 | −40 |
| Example 12 | 1,2-polybutadiene dimethacrylate (molecular weight, 2,600), 100 | 2-hydroxyethylmethacrylate, 30 ethylene glycol methacrylate, 10 | 2-methylantraquinone, 1 | fine SiO$_2$ powder, 5; α-alumina powder, 100; γ-methacryloxypropylmethacrylate, 3; benzoyl peroxide, 3; phthalocyanine green, 0.5 | −40 |
| Example 13 | 1,2-polybutadiene dimethacrylate (molecular weight, 2,600), 100 | 2-hydroxyethylmethacrylate, 30 ethylene glycol methacrylate, 10 | 2-methylanthraquinone, 1 | α-alumina, 100; γ-methacryloxypropylmethacrylate, 3, phthalocyanine green 0.5; benzoyl peroxide, 2 | −40 |

*Mixing ratios are all in parts by weight

What is claimed is:

1. An elastic surface wave device comprising a piezoelectric substrate, at least one pair of transmitting and receiving electrodes on the surface of said substrate, and elastic surface wave absorbers formed by curing a composition, the main component of which is a resin curable by ultraviolet radiation, disposed on at least part of the zone on said piezoelectric substrate that propagates unwanted elastic surface waves, wherein said composition used to form said elastic surface wave absorbers comprises at least one photopolymerizable resin selected from the group consisting of 1,2-polybutadiene resin with terminal acryloyloxy or methacryloyloxy groups, organopolysiloxanes with terminal acryloyloxy or methacryloyloxy groups, epoxyacrylate-based resin, unsaturated polyester resins, and unsaturated urethane resin, an addition-polymerizable monomer having at least one CH$_2$=C group and a boiling point at normal pressure of not less than 100° C., and a photosensitizer, said composition being used to form single surface wave absorbers, disposed on said at least part of the zone on said piezoelectric substrate that propagates unwanted elastic surface waves, whereby an elastic surface wave device using single elastic surface wave absorbers can be provided.

2. The elastic surface wave device according to claim 1 wherein the composition used to form said elastic surface wave absorbers comprises 100 parts by weight of said at least one photopolymerizable resin selected from the group consisting of 1,2-polybutadiene resin with terminal acryloyloxy or methacryloyloxy groups, organopolysiloxanes with terminal acryloyloxy or methacryloyloxy groups, epoxyacrylate-based resins, unsaturated polyester resins, and unsaturated urethane resin, from 10 to 70 parts by weight of said an addition-polymerizable monomer having at least one CH$_2$=C group and a boiling point at normal pressure of said not less than 100° C., and from 0.05 to 5 parts by weight of a photosensitizer.

3. The elastic surface wave device according to claim 2 wherein a filler, a thixotropic agent, and a tackifying additive are also added as components to the composition used to form said elastic surface wave absorbers.

4. The elastic surface wave device according to claim 3 wherein a thermal polymerization initiator is also added as a component to the composition used to form said elastic surface wave absorbers.

5. The elastic surface wave device according to claim 3 wherein a colorant is also added as a component to the composition used to form said elastic surface wave absorbers.

6. The elastic surface wave device according to claim 3 wherein both thermal polymerization initiator and colorant are added as components to the composition used to form said elastic surface wave absorbers.

7. The elastic surface wave device according to claim 3, 4, 5 or 6 wherein one or more of the powders selected from the group consisting of α-alumina, silicon dioxide, calcium carbonate, titanium dioxide, barium sulfate, barium oxide, nickel, iron, cobalt oxide, zirconium oxide, lead oxide, lead dioxide, tungsten, tungsten oxide, bismuth oxide, and mica, are used as the filler.

8. The elastic surface wave device according to claim 7 wherein the amount of filler used is 0–250 parts by weight of α-alumina, 0–100 parts by weight of silicon dioxide, 0–200 parts by weight of calcium carbonate, 0–250 parts by weight of titanium dioxide, 0–150 parts by weight of barium sulfate, 0–120 parts by weight of barium oxide, 0–100 parts by weight of nickel, 0–120 parts by weight of iron, 0–100 parts by weight of cobalt oxide, 0–120 parts by weight of zirconium oxide, 0–100 parts by weight of lead oxide, 0–120 parts by weight of lead dioxide, 0–100 parts by weight of tungsten, 0–120 parts by weight of tungsten oxide, 0–120 parts by weight of bismuth oxide, and 0–200 parts by weight of mica, on the basis of 100 parts by weight of the photopolymerizable resin.

9. The elastic surface wave device according to claim 1, wherein said at least one photopolymerizable polymer is said 1,2-polybutadiene resin with terminal acryloyloxy or methacryloyloxy groups, the resin having a molecular weight of from 400 to 10,000.

10. The elastic surface wave device according to claim 1, wherein said at least one photopolymerizable polymer is said organopolysiloxane with terminal acryloyloxy or methacryloyloxy groups, said organopolysiloxane having a molecular weight of from 400 to 10,000.

11. The elastic surface wave device according to claim 1, wherein said at least one photopolymerizable polymer is said epoxyacrylate-based resin.

12. The elastic surface wave device according to claim 1, wherein said addition-polymerizable monomer is at least one monomer selected from the group consisting of: styrene, vinyltoluene, acrylic acid, butyl acrylate, lauryl acrylate, 2-hydroxyethyl acrylate, 2-hydroxypropyl acrylate, methacrylic acid, butyl methacrylate, lauryl methacrylate, 2-hydroxyethyl methacrylate, 2-hydroxypropyl methacrylate, 1,6-hexanediol dimethacrylate, ethylene glycol dimethacrylate, trimethylolpropane trimethacrylate, neopentylglycol diacrylate, divinylbenzene and diacrylate.

13. The elastic surface wave device according to claim 1, wherein said photosensitizer is at least one selected from the group consisting of benzoin, benzoin derivatives, benzoin methyl ether, benzoin isopropyl ether, benzyl and benzyl derivatives, aryl diazonium salts, anthraquinone, 2-methylanthraquinone, acetophenone, acetophenone derivatives, diphenyldisulfide, benzophenone and 4-methoxy-benzophenone.

14. The elastic surface wave device according to claim 1, wherein said piezoelectric substrate is made of $LiNbO_3$ single crystals.

15. The elastic surface wave device according to claim 2, wherein the photosensitizer is used in amounts of 0.3 to 3 parts by weight.

* * * * *